(12) United States Patent
Tanaka et al.

(10) Patent No.: US 9,066,432 B2
(45) Date of Patent: Jun. 23, 2015

(54) COPPER FOIL FOR PRINTED WIRING BOARD

(75) Inventors: Koichiro Tanaka, Hitachi (JP); Misato Chuganji, Hitachi (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 67 days.

(21) Appl. No.: 13/988,183

(22) PCT Filed: Nov. 17, 2010

(86) PCT No.: PCT/JP2010/070491
§ 371 (c)(1),
(2), (4) Date: Jun. 3, 2013

(87) PCT Pub. No.: WO2012/066658
PCT Pub. Date: May 24, 2012

(65) Prior Publication Data
US 2013/0240257 A1    Sep. 19, 2013

(51) Int. Cl.
| | |
|---|---|
| *B32B 15/08* | (2006.01) |
| *H05K 1/09* | (2006.01) |
| *C23C 14/16* | (2006.01) |
| *C23C 28/02* | (2006.01) |
| *H05K 3/38* | (2006.01) |
| *C23C 26/00* | (2006.01) |
| *H05K 1/03* | (2006.01) |
| *H05K 3/02* | (2006.01) |

(52) U.S. Cl.
CPC ........... *H05K 1/09* (2013.01); *Y10T 428/12438* (2015.01); *Y10T 428/12569* (2015.01); *Y10T 428/12819* (2015.01); *Y10T 428/1291* (2015.01); *C23C 14/165* (2013.01); *C23C 28/023* (2013.01); *H05K 1/0393* (2013.01); *H05K 3/022* (2013.01); *H05K 3/384* (2013.01); *C23C 26/00* (2013.01)

(58) Field of Classification Search
CPC ................................. A01B 12/006; H05K 1/09
USPC ......... 428/607, 615, 618, 632, 633, 675, 674, 428/637, 660
See application file for complete search history.

(56) References Cited

U.S. PATENT DOCUMENTS

| | | | | |
|---|---|---|---|---|
| 3,857,683 A | * | 12/1974 | Castonguay | 428/608 |
| 3,981,691 A | * | 9/1976 | Cuneo | 428/626 |
| 4,386,139 A | * | 5/1983 | Nakatsugawa | 428/607 |
| 4,863,808 A | * | 9/1989 | Sallo | 428/601 |
| 5,217,589 A | * | 6/1993 | Arledge et al. | 204/192.3 |
| 6,171,714 B1 | * | 1/2001 | Bergkessel et al. | 428/618 |
| 7,381,475 B2 | * | 6/2008 | Suzuki | 428/553 |
| 7,696,439 B2 | * | 4/2010 | Light | 174/117 FF |
| 8,288,011 B2 | * | 10/2012 | Nagata et al. | 428/626 |
| 2006/0088723 A1 | * | 4/2006 | Suzuki | 428/612 |
| 2006/0292028 A1 | | 12/2006 | Shindo et al. | |

FOREIGN PATENT DOCUMENTS

| | | |
|---|---|---|
| JP | 2011036065 A | 2/1999 |
| JP | 2006222185 A | 8/2006 |
| JP | 2010047845 A | 3/2010 |

OTHER PUBLICATIONS

"International Preliminary Report on Patentability" dated Jun. 12, 2013 for PCT/JP2010/070491, filed Nov. 17, 2010.

* cited by examiner

*Primary Examiner* — Cathy Lam
(74) *Attorney, Agent, or Firm* — Drinker Biddle & Reath LLP

(57) ABSTRACT

Provided is a copper foil for a printed wiring board, the copper foil being suitable for achieving finer pitch, favorable in terms of manufacturing cost, and excellent both in etching ability and adhesion to an insulating substrate. The copper foil for a printed wiring board comprises a copper foil base material and a covering layer for covering at least a portion of a surface of the copper foil base material, wherein the covering layer is formed by an nickel-vanadium alloy layer containing nickel and vanadium, and a chromium layer, laminated in this order from the surface of the copper foil base material; the chromium layer contains chromium in an amount of 15-210 µg/dm$^2$; the nickel-vanadium alloy layer contains nickel and vanadium in a combined covering amount of 20-600 µg/dm$^2$; and the nickel-vanadium alloy layer contains vanadium in an amount of 3-70 wt %.

18 Claims, 3 Drawing Sheets

COPPER FOIL FOR PRINTED WIRING BOARD

BACKGROUND

1. Technical Field

The present invention relates to a copper foil for a printed wiring board, and particularly, to a copper foil for a flexible printed wiring board.

2. Related Art

Printed wiring boards have been significantly developed for the last half century, and these days, the printed wiring boards escalate in almost all of electronics. High-density packaging of components to be mounted thereon and raising a signal frequency have been progressed together with increasing needs to downsize and offer high performance to electronics in recent years, and printed wiring boards are required to have miniaturization in conductive patterns (fine pitch), high frequency solutions, and the like.

Generally, printed wiring boards are manufactured through the steps of: adhering an insulating substrate to a copper foil to form a copper-clad laminate; and forming a conductive pattern on the copper foil surface by etching. Therefore, copper foils for a printed wiring board are required to have adhesiveness to an insulating substrate and etching performance.

A surface treatment for forming irregularities on the surface of a copper foil, called a roughening treatment, is generally performed as a technique for improving the adhesiveness to an insulating substrate. For example, there is a method in which fine irregularities are formed by electrodepositing many copper grains to an M surface (roughened surface) of an electrolytic copper foil in a dendritic or spherule form using an acid copper sulfate plating bath to enhance the adhesiveness by an anchor effect. After the roughening treatment, a chromate treatment, a treatment using a silane coupling agent, or the like is generally performed in order to further improve the adhesive characteristics.

A method of forming a metal layer such as tin, chromium, copper, iron, cobalt, zinc, and nickel or an alloy layer thereof on the surface of a copper foil has also been known.

However, the method of improving the adhesiveness by the roughening treatment is disadvantageous in the formation of fine lines. That is, when an interval between conductors is reduced due to fine pitch, the roughened portion remains on the insulating substrate after formation of a circuit by etching and may cause insulation deterioration. When etching is performed over the entire roughened surface in order to prevent the above problem, a long etching time is required and a predetermined wire width may not be maintained.

A method of providing, for example, a Ni layer or a Ni—Cr alloy layer on the surface of a copper foil has a lot of room for enhancement in basic characteristics, i.e., adhesiveness to an insulating substrate. In the case of a method of providing, for example, a Cr layer on the surface of a copper foil, relatively high adhesiveness is obtained, but etching performance is poor, and thus there is a problem in that "etching residues" which are Cr remaining on the insulating substrate surface are easily generated after performing an etching treatment for forming a conductive pattern.

Accordingly, in recent years, a technique for simultaneously obtaining superior adhesiveness to an insulating substrate and superior etching performance by forming a first metal layer on the surface of a copper foil and by forming a thin Cr layer as a second metal layer having superior adhesiveness to an insulating substrate on the first metal layer so that superior etching performance is obtained has been studied and developed.

As such a technique, for example, Patent document 1 (JP 2006-222185 A) discloses that a surface-treated copper foil for a polyimide flexible copper-clad laminate, which has a high peeling strength with respect to a polyimide resin layer and is excellent in insulating reliability, etching characteristics during the formation of a wiring pattern, and flexural properties, is obtained by providing a Ni alloy layer containing Ni in an amount of 0.03 mg/dm$^2$ to 3.0 mg/dm$^2$ and/or a Cr layer and/or a Cr alloy layer as a surface-treated layer containing Cr in an amount of 0.03 mg/dm$^2$ to 1.0 mg/dm$^2$ on a Ni layer.

PRIOR ART

Patent document 1: JP 2006-222185 A

SUMMARY

However, when Ni is present in a large amount in the coating layer on the surface of the copper foil as disclosed in Patent document 1 (JP 2006-222185 A), relatively high adhesion to an insulating substrate and etching performance are obtained, but there is a room for enhancement. In addition, when the coating layer containing a large amount of Ni is formed by sputtering, a magnetic target is used. However, since the magnetic target has poor efficiency and a short life, there is a problem in that this technique is disadvantageous in terms of cost. In addition, in Patent document 1 (JP 2006-222185 A), a reduction in adhesion (corrosion resistance) due to the reaction of the surface-treated metal to corrosion gas or humidity during the period from the copper foil surface treatment to the formation of the copper-clad laminate is not recognized as a problem, and thus this problem is not studied.

Accordingly, an object of the invention is to provide a copper foil for a printed wiring board that is excellent in adhesiveness to an insulating substrate and etching performance and is superior in terms of manufacturing cost. Another object of the invention is to provide a method of manufacturing the copper foil for a printed wiring board.

Hitherto, it has been understood that superior adhesiveness to an insulating substrate and superior etching performance can be simultaneously obtained by providing a Ni layer and a Cr layer, which have an ultrathin thickness, in order on the surface of a copper foil base material. The inventors of the invention have conducted an intensive study to provide a copper foil for a printed wiring board having high adhesiveness to an insulating substrate and etching performance and as a result, found that when a Ni—V alloy layer and a Cr layer which have an ultrathin thickness of nanometer order are uniformly provided in order on the surface of a copper foil base material, the coating layer of the copper foil have more excellent adhesion to an insulating substrate and etching performance.

In addition, they have also found that in that case, heat resistance that can bear a long period of use and corrosion resistance for preventing a reduction in quality due to the reaction of the surface-treated metal to corrosion gas or moisture during the period from the copper foil surface treatment to the formation of the copper-clad laminate in the manufacturing process are improved. Here, the etching performance and the corrosion resistance conflict with each other. However, according to the invention, it has also been found that the balance therebetween is improved.

Furthermore, it has also been found that the efficiency of a sputtering target during the manufacturing is improved by adjusting metal elements in the Ni—V alloy layer, and manufacturing cost can thus be reduced.

According to an aspect of the invention completed based on the above-described findings, there is provided a copper foil for a printed wiring board, including: a copper foil base material; and a coating layer which coats at least a part of the surface of the copper foil base material, in which the coating layer is formed of a Ni—V alloy layer containing Ni and V and a Cr layer, which are laminated in order from the surface of the copper foil base material, the Cr layer contains 15 $\mu g/dm^2$ to 210 $\mu g/dm^2$ of Cr, the Ni—V alloy layer contains 20 $\mu g/dm^2$ to 600 $\mu g/dm^2$ of Ni and V in total in terms of coating amount, respectively, and the Ni—V alloy layer contains 3 wt % to 70 wt % of V.

According to an embodiment of the copper foil for a printed wiring board of the invention, the Cr layer may contain 18 $\mu g/dm^2$ to 100 $\mu g/dm^2$ of Cr, and the Ni—V alloy layer may contain 75 $\mu g/dm^2$ to 260 $\mu g/dm^2$ of Ni and V in total in terms of coating amount, respectively.

According to another embodiment of the copper foil for a printed wiring board of the invention, the Ni—V alloy layer may contain 15 $\mu g/dm^2$ to 550 $\mu g/dm^2$ of Ni and 5 $\mu g/dm^2$ to 210 $\mu g/dm^2$ of V in terms of coating amount, respectively.

According to a further embodiment of the copper foil for a printed wiring board of the invention, when a cross-section of the coating layer is observed by a transmission electron microscope, a maximum thickness may be 0.5 nm to 8.0 nm, and a minimum thickness may be 80% or greater of the maximum thickness.

According to a still further embodiment of the copper foil for a printed wiring board of the invention, in the case in which a heat treatment equivalent to a polyimide curing is performed, when the surface of the coating layer is analyzed, $\int h(x)dx/(\int f(x)dx+\int g(x)dx+\int h(x)dx+\int i(x)dx+\int j(x)dx+\int k(x)dx)$ may be 5.0% or less in a section [0, 1.0], where f(x) represents an atomic concentration (%) of chromium in a depth direction (x: unit nm) obtained from the analysis by an XPS in the depth direction from the surface, g(x) represents an atomic concentration (%) of oxygen, h(x) represents an atomic concentration (%) of copper, i(x) represents an atomic concentration (%) of nickel, j(x) represents an atomic concentration (%) of vanadium, and k(x) represents an atomic concentration (%) of carbon.

According to a still further embodiment of the copper foil for a printed wiring board of the invention, in the case in which a heat treatment equivalent to a polyimide curing is performed, when the surface of the coating layer is analyzed, $0.1 \leq \int f_1(x)dx/\int f_2(x)dx \leq 1.0$ may be satisfied in a section [0, 1.0], and $0.1 \leq \int f_1(x)dx/\int f_2(x)dx \leq 1.0$ may be satisfied in a section [1.0, 2.5], where $f_1(x)$ and $f_2(x)$ represent atomic concentrations (%) of chromium metal and chromium oxide in a depth direction (x: unit nm) obtained from the analysis by an XPS in the depth direction from the surface, respectively.

According to a still further embodiment of the copper foil for a printed wiring board of the invention, which is a copper foil subjected to a heat treatment equivalent to a polyimide curing, when the surface of the coating layer is analyzed, $\int h(x)dx/(\int f(x)dx+\int g(x)dx+\int h(x)dx+\int i(x)dx+\int j(x)dx+\int k(x)dx)$ may be 5.0% or less in a section [0, 1.0], where f(x) represents an atomic concentration (%) of chromium in a depth direction (x: unit nm) obtained from the analysis by an XPS in the depth direction from the surface, g(x) represents an atomic concentration (%) of oxygen, h(x) represents an atomic concentration (%) of copper, i(x) represents an atomic concentration (%) of nickel, j(x) represents an atomic concentration (%) of vanadium, and k(x) represents an atomic concentration (%) of carbon.

According to a still further embodiment of the copper foil for a printed wiring board of the invention, which is a copper foil subjected to a heat treatment equivalent to a polyimide curing, when the surface of the coating layer is analyzed, $0.1 \leq \int f_1(x)dx/\int f_2(x)dx \leq 1.0$ may be satisfied in a section [0, 1.0], and $0.1 \leq \int f_1(x)dx/\int f_2(x)dx \leq 1.0$ may be satisfied in a section [1.0, 2.5], where $f_1(x)$ and $f_2(x)$ represent atomic concentrations (%) of chromium metal and chromium oxide in a depth direction (x: unit nm) obtained from the analysis by an XPS in the depth direction from the surface, respectively.

According to a still further embodiment of the copper foil for a printed wiring board of the invention, when a surface of the coating layer is analyzed in a state in which a heat treatment equivalent to a polyimide curing is not performed after film formation, $\int h(x)dx/(\int f(x)dx+\int g(x)dx+\int h(x)dx+\int i(x)dx+\int j(x)dx+\int k(x)dx)$ may be 1.0% or less in a section [0, 1.0], where f(x) represents an atomic concentration (%) of chromium in a depth direction (x: unit nm) obtained from the analysis by an XPS in the depth direction from the surface, g(x) represents an atomic concentration (%) of oxygen, h(x) represents an atomic concentration (%) of copper, i(x) represents an atomic concentration (%) of nickel, j(x) represents an atomic concentration (%) of vanadium, and k(x) represents an atomic concentration (%) of carbon.

According to a still further embodiment of the copper foil for a printed wiring board of the invention, when the surface of the coating layer is analyzed in a state in which a heat treatment equivalent to a polyimide curing is not performed after film formation, $0 \leq \int f_1(x)dx/\int f_2(x)dx \leq 3.0$ may be satisfied in a section [0, 1.0], and $0.1 \leq \int f_1(x)dx/\int f_2(x)dx \leq 5.0$ may be satisfied in a section [1.0, 2.5], where $f_1(x)$ and $f_2(x)$ represent atomic concentrations (%) of chromium metal and chromium oxide in a depth direction (x: unit nm) obtained from the analysis by an XPS in the depth direction from the surface, respectively.

According to a still further embodiment of the copper foil for a printed wiring board of the invention, when a polyimide film is formed on the coating layer through: performing imidization of a polyamic acid solution as a polyimide precursor, which is applied to the coating layer to obtain a 25-μm dried body, at 120° C. for 30 minutes in the air by a drier; and performing further imidization at 350° C. for 30 minutes in a high-temperature heating furnace having a nitrogen flow rate set to 10 L/min, and then a cross-section of the coating layer after the polyimide film is detached from the coating layer in accordance with a 90°-detachment method (JIS C 6471 8.1) after being left for 168 hours under a high-temperature environment and an air atmosphere at a temperature of 150° C. is observed by a transmission electron microscope, a maximum thickness may be 0.5 nm to 8.0 nm, and a minimum thickness may be 70% or greater of the maximum thickness.

According to a still further embodiment of the copper foil for a printed wiring board of the invention, when the surface of a coating layer of a copper foil for a printed wiring board which is formed on an insulating substrate with the coating layer interposed therebetween is analyzed after detachment of the insulating substrate from the coating layer, $\int h(x)dx/(\int f(x)dx+\int g(x)dx+\int h(x)dx+\int i(x)dx+\int j(x)dx)$ may be 5.0% or less in a section [0, F], where f(x) represents an atomic concentration (%) of chromium obtained from the analysis by an XPS in a depth direction from the surface, g(x) represents an atomic concentration (%) of oxygen, h(x) represents an atomic concentration (%) of copper, i(x) represents an atomic concentration (%) of nickel, j(x) represents an atomic concentration (%) of vanadium, and F represents a distance from the surface layer at which a concentration of chromium is maximum.

According to a still further embodiment of the copper foil for a printed wiring board of the invention, when the surface of a coating layer of a copper foil for a printed wiring board which is formed on an insulating substrate with the coating layer interposed therebetween is analyzed after detachment of the insulating substrate from the coating layer, $0.1 \leq \int f_1(x) dx / \int f_2(x) dx \leq 1.0$ may be satisfied in a section [0, F], and $0.1 \leq \int f_1(x) dx / \int f_2(x) dx \leq 1.0$ may be satisfied in a section [F,I], where f(x) represents an atomic concentration (%) of chromium obtained from the analysis by an XPS in a depth direction from the surface, $f_1(x)$ represents an atomic concentration (%) of chromium metal, $f_2(x)$ represents an atomic concentration (%) of chromium oxide, and F and I represent distances from the surface layer at which a concentration of chromium and a concentration of nickel are maximum, respectively.

According to a still further embodiment of the copper foil for a printed wiring board of the invention, the copper foil base material may be a rolled copper foil.

According to a still further embodiment of the copper foil for a printed wiring board of the invention, the printed wiring board may be a flexible printed wiring board.

According to another aspect of the invention, there is provided a method of manufacturing a copper foil for a printed wiring board, including: coating at least a part of the surface of a copper foil base material with a Ni—V alloy layer having a thickness of 0.3 nm to 5.0 nm and a Cr layer having a thickness of 0.2 nm to 3.0 nm in order by a sputtering method.

According to a further aspect of the invention, there is provided a copper-clad laminate including: the copper foil according to the invention.

According to an embodiment of the copper-clad laminate of the invention, a structure in which a copper foil is adhered to a polyimide may be employed.

According to a still further aspect of the invention, there is provided a printed wiring board that has, as a material, the copper-clad laminated according to the invention.

It is possible to obtain a copper foil for a printed wiring board that is excellent in both of adhesiveness to an insulating substrate and etching performance, suitable for fine pitch, and superior in terms of manufacturing cost.

DETAILED DESCRIPTION (Copper Foil Base Material)

Figure 1:
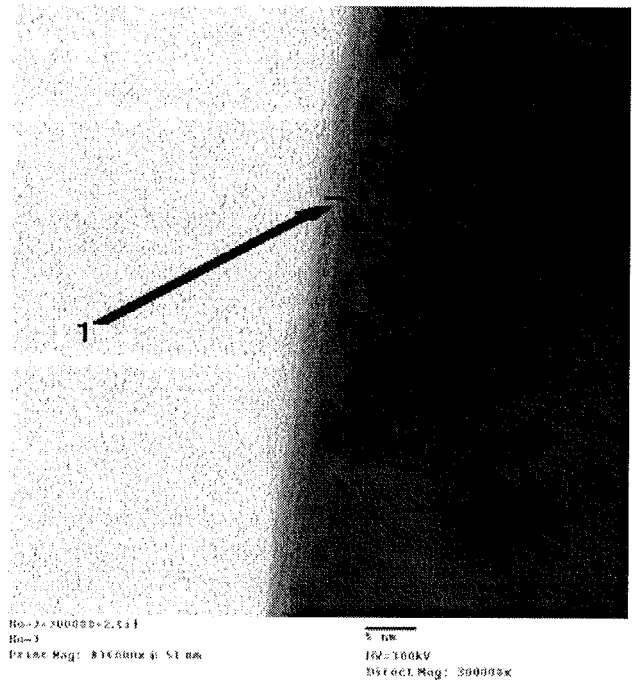
FIG. 1 is a TEM photograph (cross-section) of a copper foil (at the end of sputtering) of Example No. 10.

The form of a copper foil base material, which can be used in the invention, is not particularly limited, but typically, a rolled copper foil or an electrolytic copper foil can be used. Generally, an electrolytic copper foil is manufactured by electrolytically depositing copper on a titanium or stainless-steel drum from a copper sulfate plating bath, and a rolled copper foil is manufactured by repeatedly performing plastic working using a mill roll and a heat treatment. In many cases, a rolled copper foil is applied when flexibility is required.

In addition to high-purity copper such as tough pitch copper or oxygen-free copper which is generally used as a conductive pattern of a printed wiring board, copper alloys such as Sn-containing copper, Ag-containing copper, copper alloys having Cr, Zr, or Mg added thereto, and Corson copper alloys having Ni and Si added thereto can be used as a material of the copper foil base material. In this specification, when the term "copper foil" is used singly, it also includes a copper alloy foil.

The thickness of the copper foil base material, which can be used in the invention, is also not particularly limited, and may be appropriately adjusted to a thickness suitable for a printed wiring board. For example, the thickness can be adjusted to approximately 5 μm to 100 μm. However, in order to form a fine pattern, the thickness is 30 μm or less, and preferably 20 μm or less, and is typically approximately 6 μm to 20 μm.

It is more preferable that the copper foil base material, which is used in the invention, be not subjected to a roughening treatment. Generally, a surface roughening treatment has been performed to form irregularities of μm order on a surface by special plating to thereby obtain adhesiveness to a resin by a physical anchor effect. However, a smooth foil is favorable for fine pitch and high-frequency electric characteristics, and a roughened foil has a disadvantage with regard to this. In addition, since a roughening treatment process is omitted, economic efficiency and productivity may be improved.

(Coating Layer)

At least a part of the surface of the copper foil base material is coated with a Ni—V alloy layer and a Cr layer in order. The Ni—V alloy layer and the Cr layer form a coating layer. A position to be coated is not particularly limited, but is generally a position to be adhered to an insulating substrate. The adhesiveness to an insulating substrate is improved by the presence of the coating layer. Generally, there is a tendency that adhesion properties between the copper foil and an insulating substrate may be lowered when being left under a high-temperature environment. However, it is thought that the above reduction occurs by thermal diffusion of the copper to the surface and the reaction with the insulating substrate. In the invention, the thermal diffusion of the copper can be prevented by providing the Ni—V alloy layer, which is excellent in preventing copper diffusion, in advance on the copper foil base material. In addition, the adhesiveness to an insulating substrate can be further improved by providing, on the Ni—V alloy layer, the Cr layer that is more excellent in adhesiveness to an insulating substrate than the Ni—V alloy layer. Since the thickness of the Cr layer can be reduced by the presence of the Ni—V alloy layer, the negative influence on etching performance can be reduced. The adhesiveness mentioned in the invention includes adhesiveness (heat resistance) after leaving at a high temperature and adhesiveness (corrosion resistance and humidity resistance) after leaving in corrosion gas or under high humidity, as well as adhesiveness in a normal state.

In the copper foil for a printed wiring board according to the invention, the coating layer is ultrathin and has a uniform thickness. The reason for the improvement in adhesiveness to an insulating substrate by employing such a configuration is not clear, but it is presumed that by forming, on the Ni—V alloy coating, the single Cr layer film as an outermost surface which is very excellent in adhesiveness to a resin, a single layer film structure having high adhesiveness is maintained even after a high-temperature heat history (approximately at 350° C. for several hours) upon imidization. In addition, it is thought that since the usage of Cr is reduced by making an ultrathin coating layer and employing a two-layer structure formed of the Ni—V alloy and Cr, the etching performance is improved.

Specifically, the coating layer according to the invention has the following configuration.

(1) Identification of Cr and Ni—V Alloy Coating Layers

In the invention, at least a part of the surface of the copper foil material is coated with a Ni—V alloy layer and a Cr layer in order. For the identification of these coating layers, Ar sputtering is performed from the surface layer using a surface analyzer such as an XPS or an AES, and chemical analysis is performed in a depth direction, and thus the Ni—V alloy layer and the Cr layer can be identified by the presence of the respective detection peaks. In addition, the coating order can be confirmed from the positions of the respective detection peaks.

(2) Adhesion Amount

Since the Ni—V alloy layer and the Cr layer are ultrathin, it is difficult to accurately evaluate the thickness by an XPS or an AES. Therefore, in this specification, the thicknesses of the Ni—V alloy layer and the Cr layer are evaluated by the weight of the coating metal per unit area. According to the invention, the Cr layer contains 15 $\mu g/dm^2$ to 210 $\mu g/dm^2$ of Cr, and the Ni—V alloy layer contains 20 $\mu g/dm^2$ to 600 $\mu g/dm^2$ of Ni and V in total in terms of coating amount. When Cr is less than 15 $\mu g/dm^2$, a sufficient peeling strength cannot be obtained, and when Cr is greater than 210 $\mu g/dm^2$, there is a tendency that etching performance may be significantly reduced. When a total amount of Ni and V is less than 20 $\mu g/dm^2$, a sufficient peeling strength cannot be obtained, and when a total amount of Ni and V is greater than 600 $\mu g/dm^2$, there is a tendency that performance may be significantly reduced. The coating amount of Cr is preferably 18 $\mu g/dm^2$ to 100 $\mu g/dm^2$, and the total coating amount of Ni and V is preferably 75 $\mu g/dm^2$ to 260 $\mu g/dm^2$.

The Ni—V alloy layer contains 15 $\mu g/dm^2$ to 550 $\mu g/dm^2$ of Ni and 5 $\mu g/dm^2$ to 210 $\mu g/dm^2$ of V in terms of coating amount, respectively. When Ni is less than 15 $\mu g/dm^2$, sufficient heat resistance cannot be obtained, and when Ni is greater than 550 $\mu g/dm^2$, target efficiency is lowered due to magnetic properties and there is a disadvantage in terms of cost. When V is less than 5 $\mu g/dm^2$, sufficient corrosion resistance cannot be obtained, and when V is greater than 210 $\mu g/dm^2$, the amount of Ni becomes too small in response to this, and thus sufficient heat resistance cannot be obtained. In the Ni—V alloy layer, the coating amount of Ni is preferably 69 $\mu g/dm^2$ to 240 $\mu g/dm^2$, and the coating amount of V is preferably 6 $\mu g/dm^2$ to 20 $\mu g/dm^2$.

Pure Ni is used as a target when a pure Ni layer is sputtered. However, since this pure Ni target has strong magnetic properties, target efficiency is poor when the sputtering is performed by magnetron sputtering or the like, and thus there is a disadvantage in terms of cost. On the other hand, the Ni—V alloy layer according to the invention contains 3 wt % to 70 wt % of V. When V in the Ni—V alloy layer is less than 3 wt %, target efficiency is poor due to strong magnetic properties. When V in the Ni—V alloy layer is greater than 70 wt %, the amount of Ni is reduced in response to this, and thus heat resistance deteriorates. In addition, until the content of V becomes 70 wt %, corrosion resistance increases with an increase of the content of V. However, the corrosion resistance becomes constant when the content of V is 70 wt % or greater. V in the Ni—V alloy layer is preferably 5 wt % to 50 wt %, and more preferably 7 wt % to 20 wt %. Particularly, when V is 7 wt % or greater, a Ni—V target becomes a nonmagnetic body, and thus a significantly superior sputtering rate is obtained.

(3) Observation by Transmission Electron Microscope (TEM)

When a cross-section of the coating layer according to the invention is observed by a transmission electron microscope, the coating layer has a very reduced variation so that a maximum thickness is 0.5 nm to 8.0 nm, and preferably 0.75 nm to 4.5 nm and a minimum thickness is 80% or greater, and preferably 85% or greater of the maximum thickness. The reason for this is that when the thickness of the coating layer is less than 0.5 nm, the peeling strength significantly deteriorates in a heat resistance test and a humidity resistance test, and when the thickness is greater than 8.0 nm, etching performance is reduced. When the minimum value of the thickness is 80% or greater of the maximum value, the thickness of the coating layer is very stable and does not almost change even after the heat resistance test. In the observation by the TEM, the boundary between the Ni—V alloy layer and the Cr layer in the coating layer is not clearly found, and the coating layer is shown as a just single layer (see FIGS. 1 and 2). According to the study results of the inventors of the invention, the coating layer found in the TEM observation is thought as a layer containing Cr as a main element, and the Ni—V alloy layer is thought to be present on the side of the copper foil base material. Accordingly, in the invention, the thickness of the coating layer when being observed by the TEM is defined as a thickness of the coating layer, which is shown as a single layer. However, the boundary of the coating layer may be unclear in accordance with the observation position, and such a position is excluded from thickness measurement positions.

It is thought that a stable thickness is obtained, because diffusion of Cu is suppressed by the configuration of the invention. Even when the copper foil of the invention is adhered to a polyimide film and subjected to a heat resistance test (leaving for 168 hours under a high-temperature environment and an air atmosphere at a temperature of 150° C.), and then the resin is detached therefrom, the thickness of the coating layer does not almost change, and the maximum thickness can be maintained to be 0.5 nm to 8.0 nm and the minimum thickness can be maintained to be 70% or greater, and preferably 75% of the maximum thickness.

(4) Oxidation State of Surface of Coating Layer

First, it is desirable that internal copper is not diffused to the outermost surface of the coating layer (in the range from 0 nm to 0.5 nm from the surface) in consideration of increasing adhesion strength. Accordingly, in the copper foil for a printed wiring board according to the invention, when heating is performed for 2 hours at 350° C., $\int h(x)dx/(\int f(x)dx+\int g(x)dx+\int h(x)dx+\int i(x)dx+\int j(x)dx+\int k(x)dx)$ is preferably 5.0% or less in a section [0, 1.0], where f(x) represents an atomic concentration (%) of chromium in a depth direction (x: unit nm) obtained from the analysis by an XPS in the depth direction from the surface, $g(x)$ represents an atomic concentration (%) of oxygen, $h(x)$ represents an atomic concentration (%) of copper, $i(x)$ represents an atomic concentration (%) of nickel, $j(x)$ represents an atomic concentration (%) of vanadium, and $k(x)$ represents an atomic concentration (%) of carbon.

In addition, regarding chromium, both chromium metal and chromium oxide are present in the outermost surface of the coating layer. Chromium metal is desirable from the viewpoint of preventing diffusion of internal copper and securing adhesion properties, and chromium oxide is desirable in consideration of obtaining superior etching performance. Accordingly, in consideration of balancing the etching performance and the adhesion properties, when heating is performed for 2 hours at 350° C., $0.1 \leq \int f_1(x)dx/\int f_2(x)dx \leq 1.0$ is preferably satisfied in a section [0, 1.0], where $f_1(x)$ and $f_2(x)$ represent atomic concentrations (%) of chromium metal and chromium oxide in a depth direction (x: unit nm) obtained from the analysis by an XPS in the depth direction from the surface, respectively.

The oxygen concentration is low at a depth of 1.0 nm to 2.5 nm immediately below the outermost surface of the coating layer, and thus it is desirable that chromium is present in a metal state. The reason for this is that since chromium has a high ability to prevent diffusion of internal copper when being in a metal state rather than an oxidized state, heat resistance can be improved. However, from the viewpoint of an increase in cost with strict control of oxygen and the fact that oxidation of chromium by the presence of a certain amount of oxygen in the outermost surface is preferable for etching performance, it is not realistic to completely remove the oxygen in the layer which is immediately below the outermost surface. Accordingly, when the surface of the coating layer of the copper foil for a printed wiring board according to the invention is analyzed after heating for 2 hours at 350° C. under a nitrogen atmosphere, $0.1 \leq \int f_1(x)dx/\int f_2(x)dx \leq 1.0$ is preferable in a section [1.0, 2.5], where $f_1(x)$ and $f_2(x)$ represent atomic concentrations (%) of chromium metal and chromium oxide in a depth direction (x: unit nm) obtained from the analysis by an XPS in the depth direction from the surface, respectively.

Generally, the heating time for curing the resin is approximately 10 minutes to 60 minutes at 250° C. to 450° C. However, further severe conditions are assumed, so that the heating time is adjusted to 2 hours at 350° C.

In addition, in order to employ the above-described structure, when the surface of the coating layer is analyzed in a state in which a heat treatment equivalent to a polyimide curing is not performed after film formation, $\int h(x)dx/(\int f(x)dx + \int g(x)dx + \int h(x)dx + \int i(x)dx + \int j(x)dx + \int k(x)dx)$ is preferably 1.0% or less in a section [0, 1.0], where $f(x)$ represents an atomic concentration (%) of chromium in a depth direction (x: unit nm) obtained from the analysis by an XPS in the depth direction from the surface, $g(x)$ represents an atomic concentration (%) of oxygen, $h(x)$ represents an atomic concentration (%) of copper, $i(x)$ represents an atomic concentration (%) of nickel, $j(x)$ represents an atomic concentration (%) of vanadium, and $k(x)$ represents an atomic concentration (%) of carbon.

Furthermore, when the coating layer is formed in a state in which a heat treatment equivalent to a polyimide curing is not performed after film formation, and then the surface of the coating layer is analyzed, $0 \leq \int f_1(x)dx/\int f_2(x)dx \leq 3.0$ is satisfied, $0 \leq \int f_1(x)dx/\int f_2(x)dx \leq 1.5$ is preferably satisfied, $0 \leq \int f_1(x)dx/\int f_2(x)dx \leq 1.0$ is more preferably satisfied in a section [0, 1.0], where $f_1(x)$ and $f_2(x)$ represent atomic concentrations (%) of chromium metal and chromium oxide in a depth direction (x: unit nm) obtained from the analysis by an XPS in the depth direction from the surface, respectively. In a section [1.0, 2.5], $0.1 \leq \int f_1(x)dx/\int f_2(x)dx \leq 5.0$ is preferably satisfied.

In addition, when a surface of a coating layer of a copper foil for a printed wiring board which is attached to an insulating substrate with the coating layer interposed therebetween is analyzed after detachment of the insulating substrate from the coating layer, it is desirable that $\int h(x)dx/(\int f(x)dx + \int g(x)dx + \int h(x)dx + \int i(x)dx + \int j(x)dx)$ is 5.0% or less, and $0.1 \leq \int f_1(x)dx/\int f_2(x)dx \leq 1.0$ is satisfied in a section [0, F], where $f(x)$ represents an atomic concentration (%) of chromium obtained from the analysis by an XPS in a depth direction from the surface, $g(x)$ represents an atomic concentration (%) of oxygen, $h(x)$ represents an atomic concentration (%) of copper, $i(x)$ represents an atomic concentration (%) of nickel, $j(x)$ represents an atomic concentration (%) of vanadium, and F represents a distance from the surface layer at which the concentration of chromium is maximum.

In addition, when a surface of a coating layer of a copper foil for a printed wiring board which is attached to an insulating substrate with the coating layer interposed therebetween is analyzed after detachment of the insulating substrate from the coating layer, $0.1 \leq \int f_1(x)dx/\int f_2(x)dx \leq 1.0$ is preferable in a section [F,I], where $f(x)$ represents an atomic concentration (%) of chromium obtained from the analysis by an XPS in a depth direction from the surface, $f_1(x)$ represents an atomic concentration (%) of chromium metal, $f_2(x)$ represents an atomic concentration (%) of chromium oxide, and F and I represent distances from the surface layer at which the concentration of chromium and the concentration of nickel are maximum, respectively.

The chromium concentration and the oxygen concentration are calculated from peak strengths of a Cr2p orbit and an O1s orbit obtained from the analysis by an XPS in the depth direction from the surface, respectively. In addition, the distance in the depth direction (x: unit nm) is calculated from the sputtering rate of $SiO_2$ conversion. The chromium concentration is the sum of the concentration of chromium oxide and the concentration of chromium metal, and can be separated into the concentration of chromium oxide and the concentration of chromium metal for being analyzed.

(Method of Manufacturing Copper Foil According to Invention)

The copper foil for a printed wiring board according to the invention can be formed by a sputtering method. That is, the copper foil for a printed wiring board can be manufactured by coating at least a part of a surface of a copper foil base material with a Ni—V alloy layer having a thickness of 0.3 nm to 5.0 nm, preferably 0.3 nm to 4.0 nm, and more preferably 0.5 nm to 3.0 nm and a Cr layer having a thickness of 0.2 nm to 3.0 nm, preferably 0.4 nm to 2.0 nm, and more preferably 0.5 nm to 1.0 nm in order by a sputtering method. When such ultrathin films are laminated by electroplating, a variation occurs in thickness, and the peeling strength is easily reduced after a heat resistance test and a humidity resistance test.

The thickness mentioned herein is not determined by the above-described XPS or TEM, but is derived from the film forming rate of the sputtering. The film forming rate under certain sputtering conditions can be measured from the relation between a sputtering time and a sputtering thickness that is obtained through sputtering at 0.1 μm (100 nm) or greater. When the film forming rate under the sputtering conditions can be measured, the sputtering time is set in accordance with a desired thickness. The sputtering may be performed continuously or batchwise, and the coating layer can be uniformly laminated with a thickness specified in the invention. Examples of the sputtering method include a DC magnetron sputtering method.

(Manufacturing of Printed Wiring Board)

A printed wiring board (PWB) can be manufactured in the usual manner using the copper foil according to the invention. Hereinafter, an example of the manufacturing of a printed wiring board will be shown.

First, a copper-clad laminate is manufactured by attaching a copper foil and an insulating substrate to each other. The insulating substrate on which the copper foil is laminated is not particularly limited as long as it has characteristics which can be applied to a printed wiring board, and for example, a phenolic resin on a paper base material, an epoxy resin on a paper base material, an epoxy resin on a synthetic fiber fabric base material, an epoxy resin on a glass fabric-paper composite base material, an epoxy resin on a glass fabric-nonwoven glass fabric composite base material, an epoxy resin on a glass fabric base material, and the like are used for a rigid PWB, and a polyester film, a polyimide film, and the like can be used for a FPC.

In the attachment method, for a rigid PWB, a prepreg is provided by impregnating a base material such as glass fabric with a resin and curing the resin up to a semi-cured state. The prepreg and a surface of the copper foil having a coating layer overlap each other, and are heated and pressed, thereby being attached to each other.

For a flexible printed wiring board (FPC), a polyimide film or a polyester film and a surface of the copper foil having a coating layer can be adhered to each other using an epoxy-based or acrylic adhesive (three-layer structure). In addition, as a method using no adhesive (two-layer structure), a casting method in which a polyimide varnish (polyamic acid varnish), which is a precursor of a polyimide, is applied to a surface of a copper foil having a coating layer and heated to be imidized, or a laminating method in which a thermoplastic polyimide is applied to a polyimide film, a surface of a copper foil having a coating layer overlap thereon, and then heating and pressing are performed thereon is exemplified. In the casting method, it is also effective to apply an anchor coating material such as a thermoplastic polyimide in advance before application of a polyimide varnish.

The effect of the copper foil according to the invention is exhibited in the manufacturing of a FPC by employing the casting method. That is, when a copper foil and a resin are attached to each other without using an adhesive, adhesiveness of the copper foil to the resin is particularly required. However, since the copper foil according to the invention is particularly excellent in adhesiveness to a resin, particularly to a polyimide, it can be said that the copper foil according to the invention is suitable for manufacturing of a copper-clad laminate by a casting method.

A copper-clad laminate according to the invention can be used for various printed wiring boards (PWBs), and is not particularly limited. However, for example, it can be applied to a single-side PWB, a double-side PWB, and a multilayer PWB (three or more layers) from the viewpoint of the number of layers of a conductive pattern, and can also be applied to a rigid PWB, a flexible PWB (FPC), and a rigid-flexible PWB from the viewpoint of the kind of the material of the insulating substrate.

Those skilled in the art may use a well-known method for the process of manufacturing a printed wiring board from a copper-clad laminate. For example, an etching resist may be applied only to a necessary portion as a conductive pattern on a copper foil surface of a copper-clad laminate, a conductive pattern may be formed by removing an unnecessary copper foil by spraying an etching liquid to the copper foil surface, and then the etching resist may be detached and removed to expose the conductive pattern.

EXAMPLES

Hereinafter, examples of the invention will be shown, but these are provided only to understand the invention better rather than to limit the invention.

A rolled copper foil (C1100 manufactured by JX Nippon Mining & Metals Corporation) having a thickness of 17 μm and an electrolytic copper foil not subjected to a roughening treatment were provided as copper foil base materials. The surface roughnesses (Rz) of the rolled copper foil and the electrolytic copper foil were 0.7 μm and 1.5 μm, respectively.

A Ni—V alloy layer and a Cr layer were formed in order on one side of the copper foil after a thin oxide film attached to a surface of the copper foil base material was removed in advance by reverse sputtering under the following conditions. The thickness of the coating layer was changed by adjusting a film forming time.

Device: Batch-Type Sputter (Ulvac, Inc., Type: MNS-6000)

Ultimate Vacuum: $1.0 \times 10^{-5}$ Pa

Sputtering Pressure: 0.2 Pa

Reverse Sputtering Electricity: RF100 W

Target:

For Ni—V alloy layer =Ni—V alloys having various target compositions and alloy compositions shown in the following Table 1.

The target composition and the film alloy composition are not essentially the same as each other, because the sputtering rate varies according to constituent elements.

For Cr Layer=Cr (purity: 3 N)

Sputtering Output: 2.5 W/cm$^2$

Film Forming Rate: A film having a thickness of approximately 2.0 μm was formed for each target with an output of 2.5 W/cm$^2$, and the thickness was measured by a three-dimensional measuring machine to calculate a sputtering rate per unit time.

Efficiency of Target: The time when a backing plate was exposed was regarded as the end of the life of a target. A difference between the "weight of the target before using" and the "weight of the target used up to the end of the target life" was set as "usage of the target", and a numerical value obtained by dividing the "usage of the target" by the "weight of the target before using" was set as "target efficiency". The "target efficiency" of each target was calculated.

In addition, in Comparative Examples No. 22 and No. 23 to be described later, Ni electroplating and a chromate treatment were performed in order under the following conditions.

(1) Ni Plating

Plating Bath: Nickel Sulfamate (110 g/L as Ni$^{2+}$), $H_3BO_3$ (40 g/L)

Current Density: 1.0 A/dm$^2$

Bath Temperature: 55° C.

(2) Chromate Treatment

Plating Bath: $CrO_3$ (1 g/L), Zn (powder, 0.4 g), $Na_3SO_4$ (10 g/L)

Current Density: 2.0 A/dm$^2$

Bath Temperature: 55° C.

A polyimide film was adhered to a copper foil provided with a coating layer in the following procedures.

(1) Applying a U varnish-A (polyimide varnish) manufactured by Ube Industries, Ltd. to a copper foil having a size of 7 cm×7 cm using an applicator to obtain a 25 μm dried body.

(2) Drying the copper foil with the resin attached thereto, obtained in Process (1), at 120° C. for 30 minutes in the air by a drier.

(3) Heating at 350° C. for 30 minutes in a high-temperature heating furnace having a nitrogen flow rate set to 10 L/min to cure the resin.

<Measurement of Adhesion Amount>

A coating layer on a surface of a copper foil having a size of 50 mm×50 mm was dissolved in a solution obtained by mixing $HNO_3$ (2 wt %) with HCl (5 wt %), and concentrations of the respective metals in the solution were quantitatively determined using an ICP emission spectrophotometer (manufactured by SII Nano Technology Inc., SFC-3100) to calculate a metal amount ($\mu g/dm^2$) per unit area. The measurement was performed 5 times for each sample, and an average value of the measured values was set as an adhesion amount.

<Measurement by XPS>

Operating conditions of an XPS in the creation of a depth profile of a coating layer are as follows.

Device: XPS measuring device (Ulvac-Phi, Inc., Type: 5600MC)

Ultimate Vacuum: $4.5 \times 10^{-7}$ Pa

X-Ray: Single color AlKα, X-ray Output=210 W, Detection Area=800 μmφ, Angle Between Sample and Detector=45°

Ion Beam: Ion Kind=$Ar^+$, Acceleration Voltage=3 kV, Sweeping Area=3 mm×3 mm, Sputtering Rate=2.0 nm/min ($SiO_2$ conversion).

In the results of the measurement by the XPS, the separation between chromium oxide and chromium metal was performed using analysis software Multi Pak V7.3.1 manufactured by Ulvac, Inc.

<Measurement by TEM>

Figure 2:
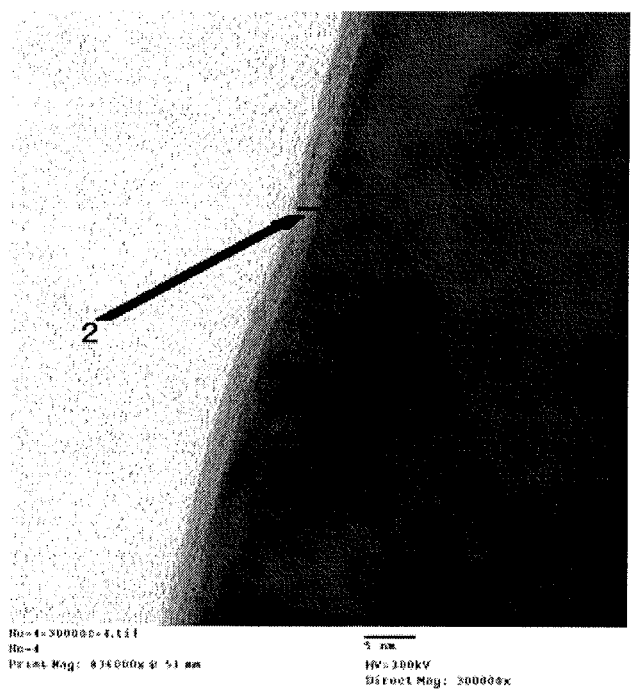
FIG. 2 is a TEM photograph (cross-section) of a copper foil (after a heat treatment equivalent to a polyimide varnish curing) of Example No. 10.

Measurement conditions of a TEM in the observation of the coating layer by the TEM are shown as follows. With respect to the thicknesses shown in the Tables, regarding a thickness of the whole coating layer taken in an observation visual field, a maximum value and a minimum value of the thickness in 50 nm in one visual field are measured, and maximum values and minimum values in three visual fields which are arbitrarily selected are obtained to obtain a maximum value and a ratio of a minimum value to the maximum value in percentage. In addition, in the Tables, the result of the TEM observation "after a heat resistance test" represents a TEM image which is obtained after detachment of a polyimide film from a test piece, obtained by making the polyimide film adhered to a coating layer of the test piece in the above-described procedures and by being left under the following high-temperature environment, in accordance with a 90°-detachment method (JIS C 6471 8.1). FIGS. 1 and 2 illustrate an exemplary observation photograph obtained simultaneously after sputtering by the TEM and an exemplary observation photograph obtained after a heat treatment equivalent to the polyimide varnish curing, respectively.

Device: TEM (Hitachi, Ltd., Type: H9000NAR)

Acceleration Voltage: 300 kV

Magnification: 300000 times power

Observation Visual Field: 60 nm×60 nm

<Adhesiveness Evaluation>

A peeling strength of the copper foil on which the polyimide was laminated as described above was measured under three conditions, i.e., immediately after lamination (normal state), after leaving for 168 hours under a high-temperature environment and an air atmosphere at a temperature of 150° C. (heat resistance), and after leaving for 96 hours under a high-humidity environment and an air atmosphere at a temperature of 40° C. and a relative humidity of 95% (humidity resistance). In addition, a corrosion test was performed on the copper foil before lamination of the polyimide in accordance with (JIS Z 2371), and then the polyimide was laminated as described above and a peeling strength was measured (corrosion resistance). The peeling strength was measured in accordance with a 90°-detachment method (JIS C6471 8.1).

<Etching Performance Evaluation>

A tape was attached to the coating layer and subjected to an etching treatment using an etching liquid (copper chloride dioxide, ammonium chloride, ammonia water, liquid temperature: 50° C.). After the treatment, etching residues (Cr, Ni, V) remaining on the tape were quantitatively determined using an ICP emission spectrophotometer, and evaluated by the following standards.

x: Etching residues are 140 $\mu g/dm^2$ or greater.

Δ: Etching residues are 70 $\mu g/dm^2$ to less than 140 $\mu g/dm^2$.

◯: Etching residues are less than 70 $\mu g/dm^2$.

The measurement conditions and the measurement results are shown in Tables 1 and 2. SP/SP represents that both of a Ni—V alloy coating and a Cr coating are formed by sputtering. In addition, in Tables 1 and 2, No. 1 to No. 18 correspond to the examples according to the invention, and No. 19 to No. 28 correspond to the comparative examples.

TABLE 1

| No | Base Material | Film Forming Method Ni—V Alloy/Cr | Thickness (nm) Ni—V Alloy | Thickness (nm) Cr | Target Composition V (wt %) | Adhesion Amount ($\mu g/dm^2$) Ni—V Alloy Layer Ni | V | Ni + V | V (wt %) | Cr Layer |
|---|---|---|---|---|---|---|---|---|---|---|
| 1 | Rolled Copper Foil | SP/SP | 5.1 | 1.0 | 7 | 406 | 30 | 436 | 7 | 70 |
| 2 | Rolled Copper Foil | SP/SP | 0.5 | 1.0 | 20 | 24 | 6 | 30 | 20 | 71 |
| 3 | Rolled Copper Foil | SP/SP | 1.0 | 3.0 | 7 | 81 | 6 | 87 | 7 | 205 |
| 4 | Rolled Copper Foil | SP/SP | 1.0 | 0.3 | 7 | 75 | 6 | 81 | 7 | 21 |

TABLE 1-continued

| | | | | | | | | | |
|---|---|---|---|---|---|---|---|---|---|
| 5 | Rolled Copper Foil | SP/SP | 0.5 | 0.5 | 20 | 24 | 6 | 30 | 20 | 38 |
| 6 | Rolled Copper Foil | SP/SP | 0.8 | 0.5 | 7 | 67 | 5 | 72 | 7 | 36 |
| 7 | Rolled Copper Foil | SP/SP | 3.0 | 1.5 | 7 | 246 | 18 | 264 | 7 | 108 |
| 8 | Rolled Copper Foil | SP/SP | 3.0 | 1.5 | 50 | 117 | 112 | 229 | 50 | 110 |
| 9 | Rolled Copper Foil | SP/SP | 2.5 | 1.0 | 5 | 201 | 11 | 212 | 5 | 72 |
| 10 | Electrolytic Copper Foil | SP/SP | 1.3 | 1.0 | 7 | 106 | 8 | 114 | 7 | 69 |
| 11 | Rolled Copper Foil | SP/SP | 1.0 | 1.0 | 20 | 60 | 14 | 74 | 20 | 75 |
| 12 | Rolled Copper Foil | SP/SP | 1.5 | 1.0 | 50 | 62 | 60 | 122 | 50 | 68 |
| 13 | Rolled Copper Foil | SP/SP | 0.5 | 1.0 | 70 | 18 | 44 | 62 | 70 | 70 |
| 14 | Rolled Copper Foil | SP/SP | 6.9 | 1.0 | 7 | 547 | 42 | 589 | 7 | 70 |
| 15 | Rolled Copper Foil | SP/SP | 5.6 | 1.0 | 50 | 202 | 205 | 407 | 50 | 68 |
| 16 | Rolled Copper Foil | SP/SP | 1.0 | 0.2 | 7 | 80 | 6 | 86 | 7 | 15 |
| 17 | Rolled Copper Foil | SP/SP | 0.2 | 1.0 | 50 | 11 | 11 | 22 | 50 | 71 |
| 18 | Rolled Copper Foil | SP/SP | 2.4 | 1.0 | 3 | 200 | 6 | 206 | 3 | 72 |
| 19 | Rolled Copper Foil | SP/SP | (Ni Only) 1.0 | 1.0 | — | 89 | — | (Ni Only) 89 | — | 75 |
| 20 | Rolled Copper Foil | SP/SP | 2.0 | 1.0 | 2 | 298 | 6 | 304 | 2 | 73 |
| 21 | Rolled Copper Foil | SP/SP | 1.5 | 1.0 | 80 | 18 | 72 | 90 | 80 | 69 |
| 22 | Rolled Copper Foil | SP/SP | 1.0 | 4.0 | 7 | 82 | 6 | 88 | 7 | 286 |
| 23 | Rolled Copper Foil | SP/SP | 1.0 | 0.1 | 7 | 88 | 7 | 95 | 7 | 7 |
| 24 | Rolled Copper Foil | SP/SP | 7.1 | 1.0 | 7 | 580 | 45 | 625 | 7 | 74 |
| 25 | Rolled Copper Foil | SP/SP | 7.5 | 1.0 | 20 | 486 | 121 | 607 | 20 | 70 |
| 26 | Rolled Copper Foil | SP/SP | 0.2 | 1.0 | 20 | 12 | 3 | 15 | 20 | 69 |
| 27 | Plating/Chromate | Plating/Chromate | — | — | — | 95 | — | 95 | — | 38 |
| 28 | Rolled Copper Foil | Plating/Chromate | — | — | — | 120 | — | 120 | — | 40 |

TABLE 1-continued

| | TEM Observation | | | |
|---|---|---|---|---|
| | Immediately After Sputtering | | After Heat Resistance Test | |
| No | Maximum Thickness of Coating Layer (nm) | Minimum Value/Maximum Value (%) | Maximum Thickness of Coating Layer (nm) | Minimum Value/Maximum Value (%) |
| 1 | 6.3 | 90 | 6.3 | 85 |
| 2 | 1.4 | 85 | 1.3 | 85 |
| 3 | 4.2 | 80 | 3.8 | 75 |
| 4 | 1.2 | 90 | 1.1 | 80 |
| 5 | 1 | 80 | 1.0 | 80 |
| 6 | 1.2 | 85 | 1.0 | 75 |
| 7 | 4.6 | 90 | 4.4 | 85 |
| 8 | 4.8 | 85 | 4.5 | 80 |
| 9 | 3.3 | 85 | 3.2 | 80 |
| 10 | 2.1 | 90 | 2.1 | 90 |
| 11 | 2.1 | 80 | 1.8 | 75 |
| 12 | 2.5 | 85 | 2.3 | 80 |
| 13 | 1.5 | 90 | 1.5 | 85 |
| 14 | 8.2 | 80 | 8.0 | 85 |
| 15 | 6.5 | 90 | 6.3 | 80 |
| 16 | 1.2 | 90 | 1.1 | 85 |
| 17 | 1.2 | 85 | 1.2 | 80 |
| 18 | 3.5 | 90 | 3.5 | 85 |
| 19 | 2 | 90 | 1.8 | 85 |
| 20 | 3.2 | 80 | 3.0 | 75 |
| 21 | 2.7 | 80 | 2.7 | 70 |
| 22 | 5.2 | 85 | 5.1 | 80 |
| 23 | 1.1 | 90 | 1.1 | 80 |
| 24 | 8.2 | 85 | 8.0 | 80 |
| 25 | 8.6 | 80 | 8.5 | 75 |
| 26 | 1.4 | 85 | 1.3 | 85 |
| 27 | 1.5 | 20 | 1.5 | 20 |
| 28 | 2.0 | 30 | 2.0 | 25 |

TABLE 2

| | XPS Surface Analysis (at the end of sputtering) | | | XPS Surface Analysis (after heating test) | | | XPS Surface analysis (after detachment of insulating substrate) | | |
|---|---|---|---|---|---|---|---|---|---|
| | Surface Depth X = 0 to 1.0 nm ($SiO_2$ conversion) | | Surface Depth X = 1.0 to 2.5 nm ($SiO_2$ conversion) | Surface Depth X = 0 to 1.0 nm ($SiO_2$ conversion) | | Surface Depth X = 1.0 to 2.5 nm ($SiO_2$ conversion) | Surface Depth X = 0 to F nm ($SiO_2$ conversion) | | Surface Depth X = F to I nm ($SiO_2$ conversion) |
| No | $\int f_1(x)dx/\int f_2(x)dx$ | Cu (%) | $\int f_1(x)dx/\int f_2(x)dx$ | $\int f_1(x)dx/\int f_2(x)dx$ | Cu (%) | $\int f_1(x)dx/\int f_2(x)dx$ | $\int f_1(x)dx/\int f_2(x)dx$ | Cu (%) | $\int f_1(x)dx/\int f_2(x)dx$ |
| 1 | 0.8 | 0.2 | 0.8 | 0.3 | 0.3 | 0.7 | 0.3 | 0.5 | 0.6 |
| 2 | 1.1 | 0.3 | 1.0 | 0.4 | 4.0 | 0.5 | 0.5 | 0.8 | 0.5 |
| 3 | 0.2 | 0.3 | 0.3 | 0.2 | 0.4 | 0.2 | 0.2 | 0.4 | 0.4 |
| 4 | 2.0 | 0.8 | 3.0 | 0.4 | 3.0 | 0.8 | 0.4 | 4.5 | 0.9 |
| 5 | 2.5 | 0.9 | 4.5 | 0.3 | 3.0 | 0.8 | 0.4 | 3.0 | 0.8 |
| 6 | 2.0 | 0.8 | 3.5 | 0.2 | 2.5 | 0.9 | 0.4 | 2.0 | 0.8 |
| 7 | 1.0 | 0 | 2.5 | 0.3 | 0.4 | 0.3 | 0.3 | 0.4 | 0.5 |
| 8 | 0.3 | 0.4 | 0.5 | 0.2 | 0.4 | 0.7 | 0.2 | 0.7 | 0.5 |
| 9 | 1.2 | 0.3 | 2.0 | 0.4 | 0.3 | 0.5 | 0.4 | 0.5 | 0.6 |
| 10 | 0.8 | 0.5 | 1.8 | 0.3 | 0.3 | 0.8 | 0.3 | 0.4 | 0.4 |
| 11 | 0.8 | 0.3 | 0.8 | 0.2 | 0.4 | 0.7 | 0.2 | 0.4 | 0.6 |
| 12 | 0.5 | 0.6 | 1.8 | 0.3 | 0.4 | 0.8 | 0.3 | 0.6 | 0.5 |
| 13 | 0.8 | 0.2 | 1.0 | 0.4 | 0.6 | 0.6 | 0.4 | 0.7 | 0.5 |
| 14 | 1.0 | 0.3 | 1.2 | 0.4 | 0.4 | 0.6 | 0.3 | 0.5 | 0.5 |
| 15 | 0.8 | 0.2 | 0.7 | 0.3 | 0.4 | 0.7 | 0.3 | 0.4 | 0.5 |
| 16 | 2.0 | 0.8 | 3.5 | 0.4 | 3.0 | 0.8 | 0.4 | 3.0 | 0.9 |
| 17 | 2.5 | 0.8 | 4.5 | 0.3 | 2.5 | 0.9 | 0.4 | 3.0 | 0.7 |
| 18 | 1.1 | 0.3 | 1.8 | 0.4 | 0.4 | 0.5 | 0.5 | 0.7 | 0.5 |
| 19 | 0.8 | 0.3 | 1.8 | 0.4 | 0.3 | 0.6 | 0.4 | 0.5 | 0.6 |
| 20 | 0.5 | 0.3 | 1.8 | 0.4 | 0.4 | 0.7 | 0.3 | 0.6 | 0.7 |
| 21 | 0.8 | 0.4 | 3.0 | 0.5 | 7.0 | 0.8 | 0.4 | 6.5 | 0.7 |
| 22 | 0.3 | 0.6 | 3.5 | 0.3 | 0.3 | 0.3 | 0.4 | 0.6 | 0.2 |
| 23 | 2.0 | 2.5 | — | 0.3 | 0.3 | — | 0.2 | 0.6 | — |
| 24 | 0.8 | 0.4 | 2.2 | 0.2 | 0.3 | 0.8 | 0.3 | 0.5 | 0.8 |
| 25 | 1.2 | 0.3 | 2.2 | 0.3 | 0.3 | 0.7 | 0.3 | 0.6 | 0.5 |

TABLE 2-continued

| | | | | | | | | | |
|---|---|---|---|---|---|---|---|---|---|
| 26 | 0.8 | 1.5 | 1.0 | 0.4 | 7.0 | 0.6 | 0.2 | 7.5 | 0.6 |
| 27 | — | 0.7 | — | — | 0.7 | — | — | 1.2 | — |
| 28 | — | 0.8 | — | — | 0.8 | — | — | 1.0 | — |

| | Peeling Strength (kN/m) | | | | Target | Etching |
|---|---|---|---|---|---|---|
| No | Normal State | Heat Resistance | Corrosion Resistance | Humidity Resistance | Efficiency (%) | Residues ($\mu g/dm^2$) |
| 1 | 1.61 | 1.52 | 1.52 | 1.47 | 40 | 78(Δ) |
| 2 | 1.55 | 1.39 | 1.37 | 1.40 | 40 | 32(○) |
| 3 | 1.65 | 1.46 | 1.35 | 1.29 | 40 | 84(Δ) |
| 4 | 1.53 | 1.40 | 1.35 | 1.31 | 40 | <20(○) |
| 5 | 1.50 | 1.38 | 1.30 | 1.36 | 40 | <20(○) |
| 6 | 1.52 | 1.40 | 1.32 | 1.35 | 40 | <20(○) |
| 7 | 1.71 | 1.50 | 1.52 | 1.40 | 40 | 54(○) |
| 8 | 1.68 | 1.50 | 1.49 | 1.40 | 40 | 58(○) |
| 9 | 1.62 | 1.51 | 1.53 | 1.39 | 35 | 48(○) |
| 10 | 1.59 | 1.42 | 1.40 | 1.37 | 40 | 29(○) |
| 11 | 1.59 | 1.42 | 1.45 | 1.40 | 40 | 33(○) |
| 12 | 1.63 | 1.48 | 1.43 | 1.39 | 40 | 42(○) |
| 13 | 1.50 | 1.38 | 1.33 | 1.35 | 40 | 37(○) |
| 14 | 1.54 | 1.43 | 1.40 | 1.40 | 40 | 95(Δ) |
| 15 | 1.59 | 1.53 | 1.52 | 1.45 | 40 | 80(Δ) |
| 16 | 1.55 | 1.40 | 1.33 | 1.30 | 40 | <20(○) |
| 17 | 1.52 | 1.38 | 1.35 | 1.42 | 40 | 32(○) |
| 18 | 1.58 | 1.45 | 1.48 | 1.41 | 30 | 55(○) |
| 19 | 1.71 | 1.62 | 0.87 | 1.45 | 5 | 39(○) |
| 20 | 1.55 | 1.52 | 0.57 | 1.38 | 10 | 53(○) |
| 21 | 1.66 | 1.02 | 1.42 | 1.35 | 40 | 42(○) |
| 22 | 1.68 | 1.47 | 1.38 | 1.36 | 40 | 219(x) |
| 23 | 0.47 | 0.23 | 0.34 | 0.72 | 40 | 35(○) |
| 24 | 1.64 | 1.48 | 1.40 | 1.37 | 40 | 187(x) |
| 25 | 1.62 | 1.50 | 1.42 | 1.40 | 40 | 163(x) |
| 26 | 1.01 | 0.39 | 0.26 | 0.53 | 40 | 36(○) |
| 27 | 0.69 | 0.64 | 0.32 | 0.68 | — | 32(○) |
| 28 | 0.75 | 0.68 | 0.37 | 0.71 | — | 40(○) |

Evaluation of Examples

Figure 3:
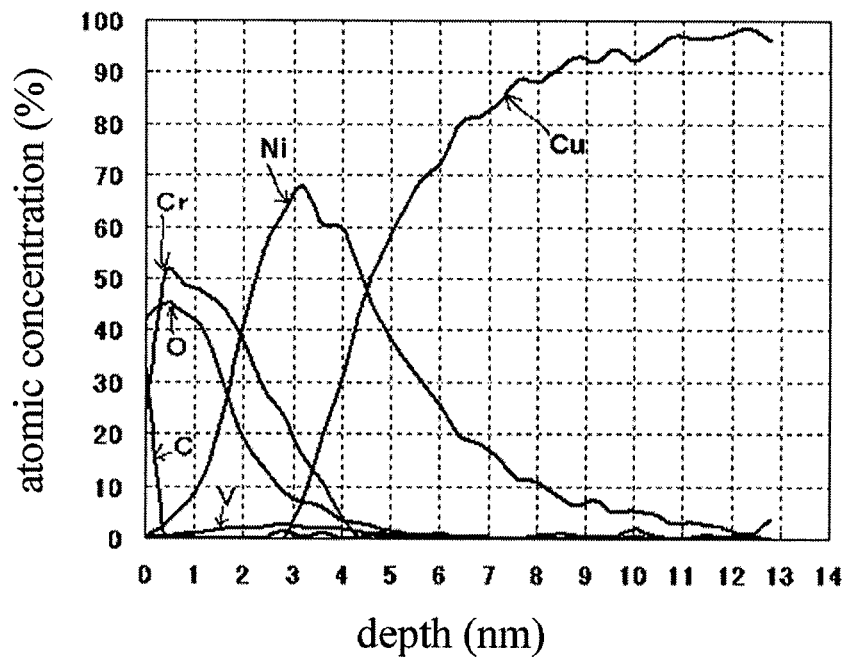
FIG. 3 is a depth profile of a copper foil (at the end of sputtering) of Example No. 7, obtained by an XPS.
Figure 4:
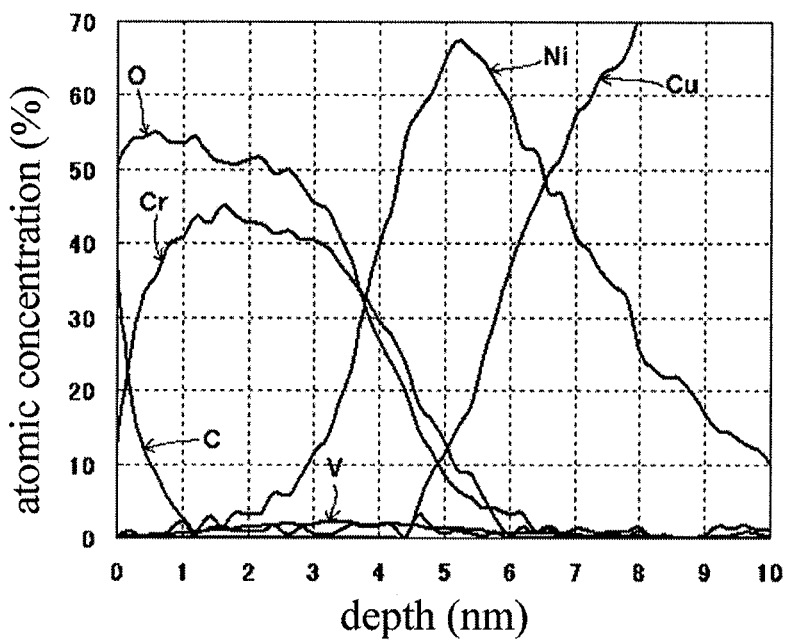
FIG. 4 is a depth profile of a copper foil (after a heat treatment equivalent to a polyimide varnish curing) of Example No. 7, obtained by an XPS.
Figure 5:
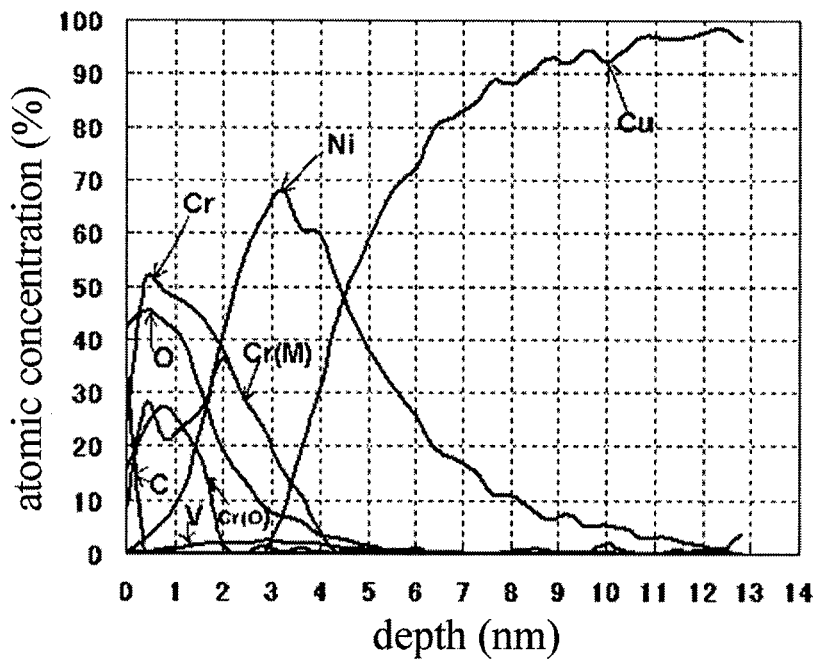
FIG. 5 is a depth profile of a copper foil (at the end of sputtering) of Example No. 7, obtained by an XPS when chromium is separated into chromium metal and chromium oxide.
Figure 6:
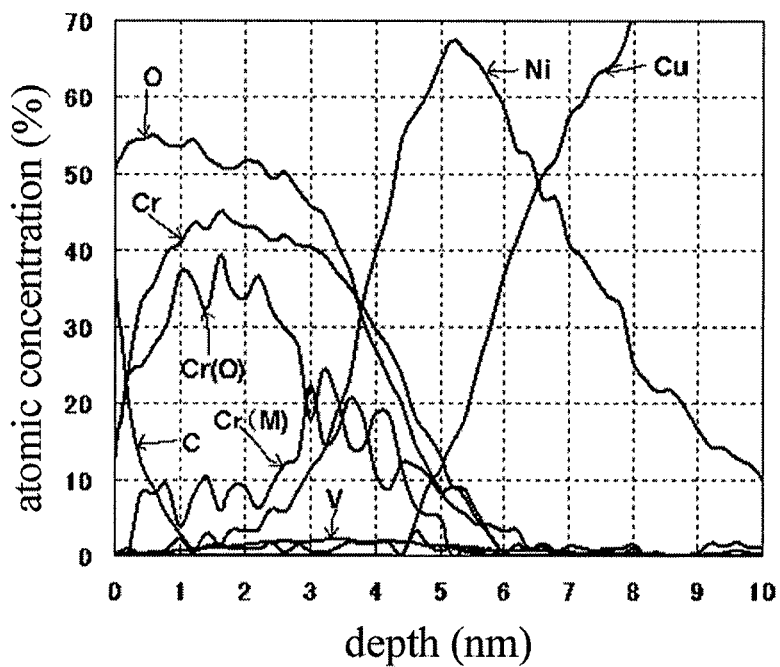
FIG. 6 is a depth profile of a copper foil (after a heat treatment equivalent to a polyimide curing varnish) of Example No. 7, obtained by an XPS when chromium is separated into chromium metal and chromium oxide.

As shown in Tables 1 and 2, all of Examples No. 1 to No. 18 have a superior peeling strength and etching performance. For reference, as for the copper foil of Example No. 7, FIGS. 3 and 4 illustrate depth profiles obtained by the XPS at the end of sputtering and after a heat treatment equivalent to the polyimide varnish curing, respectively. Furthermore, as for the copper foil of Example No. 7, FIGS. 5 and 6 illustrate depth profiles obtained by the XPS when chromium is separated into chromium metal and chromium oxide at the end of sputtering and after a heat treatment equivalent to the polyimide varnish curing, respectively.

All of the Ni—V targets used in Examples No. 1 to No. 18 had superior target efficiency. The target efficiency was 30% to 40%.

Evaluation of Comparative Examples

In Comparative Example No. 19, a Ni layer was formed in place of the Ni—V alloy layer, and corrosion resistance was poor.

In Comparative Example No. 20, V in the Ni—V alloy layer was less than 3 wt %, and corrosion resistance was poor.

In Comparative Example No. 21, V in the Ni—V alloy layer was greater than 70 wt %, and heat resistance was poor.

In Comparative Example No. 22, Cr in the Cr layer was greater than 210 $\mu g/dm^2$, and etching performance was poor.

In Comparative Example No. 23, Cr in the Cr layer was less than 15 $\mu g/dm^2$, and a peeling strength (normal state, heat resistance, corrosion resistance) was poor.

In Comparative Example No. 24, Ni and V in the Ni—V alloy layer were greater than 600 $\mu g/dm^2$ in total, and etching performance was poor.

In Comparative Example No. 25, Ni and V in the Ni—V alloy layer were greater than 600 $\mu g/dm^2$ in total, and etching performance was poor.

In Comparative Example No. 26, Ni and V in the Ni—V alloy layer were less than 20 $\mu g/dm^2$ in total, and heat resistance, corrosion resistance, and humidity resistance were poor.

In Comparative Examples No. 27 and No. 28, the coating layer was formed by Ni electroplating and a chromate treatment, but a peeling strength was poor.

The efficiency of the Ni target used in Comparative Example No. 19 and the efficiency of the Ni—V target used in Comparative Example No. 20 were 5% and 10%, respectively, and lower than those of the examples. The efficiencies of the Ni—V targets used in Comparative Examples No. 21 to No. 28 were 40%, and the same as those in the examples.

EXPLANATION OF SYMBOL 1, 2 thickness of the coating layer at an observation by TEM.

What is claimed is:

1. A copper foil for a printed wiring board, comprising:
a copper foil base material; and
a coating layer which coats at least a part of a surface of the copper foil base material,
wherein the coating layer is formed of a Ni—V alloy layer containing Ni and V and a Cr layer, which are laminated in order from the surface of the copper foil base material, the Cr layer contains 15 $\mu g/dm^2$ to 210 $\mu g/dm^2$ of Cr, and the Ni—V alloy layer contains 20 $\mu g/dm^2$ to 600 $\mu g/dm^2$ of Ni and V in total in terms of coating amount, respectively, and the Ni—V alloy layer contains 3 wt % to 70 wt % of V.

2. The copper foil for a printed wiring board according to claim 1,
wherein the Cr layer contains 18 µg/dm² to 100 µg/dm² of Cr, and the Ni—V alloy layer contains 75 µg/dm² to 260 µg/dm² of Ni and V in total in terms of coating amount, respectively.

3. The copper foil for a printed wiring board according to claim 1,
wherein the Ni—V alloy layer contains 15 µg/dm² to 550 µg/dm² of Ni and 5 µg/dm² to 210 µg/dm² of V in terms of coating amount, respectively.

4. The copper foil for a printed wiring board according to claim 1,
wherein when a cross-section of the coating layer is observed by a transmission electron microscope, a maximum thickness is 0.5 nm to 8.0 nm, and a minimum thickness is 80% or greater of the maximum thickness.

5. The copper foil for a printed wiring board according to claim 1,
wherein in the case in which a heat treatment equivalent to a polyimide curing is performed on the copper foil, when a surface of the coating layer is analyzed, $\int h(x)dx/(\int f(x)dx+\int g(x)dx+\int h(x)dx+\int i(x)dx+\int j(x)dx+\int k(x)dx)$ is 5.0% or less in a section [0, 1.0], where f(x) represents an atomic concentration (%) of chromium in a depth direction (x: unit nm) obtained from the analysis by an XPS in the depth direction from the surface, g(x) represents an atomic concentration (%) of oxygen, h(x) represents an atomic concentration (%) of copper, i(x) represents an atomic concentration (%) of nickel, j(x) represents an atomic concentration (%) of vanadium, and k(x) represents an atomic concentration (%) of carbon.

6. The copper foil for a printed wiring board according to claim 1,
wherein in the case in which a heat treatment equivalent to a polyimide curing is performed on the copper foil, when a surface of the coating layer is analyzed, $0.1 \leq \int f_1(x)dx/\int f_2(x)dx \leq 1.0$ is satisfied in a section [0, 1.0], and $0.1 \leq \int f_1(x)dx/\int f_2(x)dx \leq 1.0$ is satisfied in a section [1.0, 2.5], where $f_1(x)$ and $f_2(x)$ represent atomic concentrations (%) of chromium metal and chromium oxide in a depth direction (x: unit nm) obtained from the analysis by an XPS in the depth direction from the surface, respectively.

7. The copper foil for a printed wiring board according to claim 1, which is a copper foil subjected to a heat treatment equivalent to a polyimide curing,
wherein when a surface of the coating layer is analyzed, $\int h(x)dx/(\int f(x)dx+\int g(x)dx+\int h(x)dx+\int i(x)dx+\int j(x)dx+\int k(x)dx)$ is 5.0% or less in a section [0, 1.0], where f(x) represents an atomic concentration (%) of chromium in a depth direction (x: unit nm) obtained from the analysis by an XPS in the depth direction from the surface, g(x) represents an atomic concentration (%) of oxygen, h(x) represents an atomic concentration (%) of copper, i(x) represents an atomic concentration (%) of nickel, j(x) represents an atomic concentration (%) of vanadium, and k(x) represents an atomic concentration (%) of carbon.

8. The copper foil for a printed wiring board according to claim 1, wherein where the copper foil is subjected to a heat treatment equivalent to a polyimide curing,
when a surface of the coating layer is analyzed, $0.1 \leq \int f_1(x)dx/\int f_2(x)dx \leq 1.0$ is satisfied in a section [0, 1.0], and $0.1 \leq \int f_1(x)dx/\int f_2(x)dx \leq 1.0$ is satisfied in a section [1.0, 2.5],
where $f_1(x)$ and $f_2(x)$ represent atomic concentrations (%) of chromium metal and chromium oxide in a depth direction (x: unit nm) obtained from the analysis by an XPS in the depth direction from the surface, respectively.

9. The copper foil for a printed wiring board according to claim 1,
wherein $\int h(x)dx/(\int f(x)dx+\int g(x)dx+\int h(x)dx+\int i(x)dx+\int j(x)dx+\int k(x)dx)$ is 1.0% or less in a section [0, 1.0], where f(x) represents an atomic concentration (%) of chromium in a depth direction (x: unit nm) obtained from the analysis by an XPS in the depth direction from the surface, g(x) represents an atomic concentration (%) of oxygen, h(x) represents an atomic concentration (%) of copper, i(x) represents an atomic concentration (%) of nickel, j(x) represents an atomic concentration (%) of vanadium, and k(x) represents an atomic concentration (%) of carbon.

10. The copper foil for a printed wiring board according to claim 1,
wherein $0 \leq \int f_1(x)dx/\int f_2(x)dx \leq 3.0$ is satisfied in a section [0, 1.0], and $0.1 \leq \int f_1(x)dx/\int f_2(x)dx \leq 5.0$ is satisfied in a section [1.0, 2.5], where $f_1(x)$ and $f_2(x)$ represent atomic concentrations (%) of chromium metal and chromium oxide in a depth direction (x: unit nm) obtained from the analysis by an XPS in the depth direction from the surface, respectively.

11. The copper foil for a printed wiring board according to claim 1, wherein:
when a polyimide film is formed on the coating layer through performing imidization of a polyamic acid solution as a precursor of a polyimide, said solution is applied to the coating layer to obtain a 25 µm thick dried body, at 120° C. for 30 minutes in the air by a drier; and performing further imidization at 350° C. for 30 minutes in a high-temperature heating furnace having a nitrogen flow rate set to 10 L/min, and
a cross-section of the coating layer after the polyimide film is detached from the coating layer in accordance with a 90°-detachment method (JIS C 6471 8.1) after being left for 168 hours under a high-temperature environment and an air atmosphere at a temperature of 150° C.,
then a maximum thickness observed for the cross-section of the coating layer by a transmission electron microscope is 0.5 nm to 8.0 nm, and a minimum thickness is 70% or greater of the maximum thickness.

12. The copper foil for a printed wiring board according to claim 1,
wherein when a surface of a coating layer of a copper foil for a printed wiring board which is formed on an insulating substrate with the coating layer interposed therebetween is analyzed after detachment of the insulating substrate from the coating layer, $\int h(x)dx/(\int f(x)dx+\int g(x)dx+\int h(x)dx+\int i(x)dx+\int j(x)dx)$ is 5.0% or less in a section [0, F],
where f(x) represents an atomic concentration (%) of chromium obtained from the analysis by an XPS in a depth direction from the surface, g(x) represents an atomic concentration (%) of oxygen, h(x) represents an atomic concentration (%) of copper, i(x) represents an atomic concentration (%) of nickel, j(x) represents an atomic concentration (%) of vanadium, and F represents a distance from the surface layer at which a concentration of chromium is maximum.

13. The copper foil for a printed wiring board according to claim 1, wherein when a surface of a coating layer of a copper foil for a printed wiring board which is formed on an insulating substrate with the coating layer interposed therebetween is analyzed after detachment of the insulating substrate from the coating layer, $0.1 \leq \int f_1(x)dx / \int f_2(x)dx \leq 1.0$ is satisfied in a section $[0, F]$, and $0.1 \leq \int f_1(x)dx / \int f_2(x)dx \leq 1.0$ is satisfied in a section $[F, I]$, where f(x) represents an atomic concentration (%) of chromium obtained from the analysis by an XPS in a depth direction from the surface, $f_1(x)$ represents an atomic concentration (%) of chromium metal, $f_2(x)$ represents an atomic concentration (%) of chromium oxide, and F and I represent distances from the surface layer at which a concentration of chromium and a concentration of nickel are maximum, respectively.

14. The copper foil for a printed wiring board according to claim 1,
wherein the copper foil base material is a rolled copper foil.

15. The copper foil for a printed wiring board according to claim 1,
wherein the printed wiring board is a flexible printed wiring board.

16. A copper-clad laminate comprising:
the copper foil according to claim 1.

17. The copper-clad laminate according to claim 16, which has a structure in which a copper foil is adhered to a polyimide.

18. A printed wiring board which has, as a material, the copper-clad laminate according to claim 16.

* * * * *